United States Patent [19]

Moore

[11] Patent Number: 4,606,073

[45] Date of Patent: Aug. 12, 1986

[54] ASSISTANCE SUMMONING SYSTEM

[76] Inventor: Alfred Z. Moore, 210 N. 2nd St., Smithfield, N.C. 27577

[21] Appl. No.: 182,443

[22] Filed: Aug. 29, 1980

Related U.S. Application Data

[63] Continuation-in-part of Ser. No. 13,013, Feb. 21, 1979, abandoned.

[51] Int. Cl.$^4$ .................... H03B 1/00

[52] U.S. Cl. .................... 455/89; 455/26; 455/54; 455/68; 455/88; 455/92; 455/95; 455/100; 455/345; 340/539

[58] Field of Search .................... 455/11, 18, 53, 54, 455/56, 57, 68, 70, 73, 26, 88, 89, 92, 95, 99, 100, 344, 345, 346, 352; 340/533, 539, 147 MD, 147 PC; 358/114, 122

[56] References Cited

U.S. PATENT DOCUMENTS

| | | | |
|---|---|---|---|
| 3,290,597 | 12/1966 | Denny | 455/58 |
| 3,699,443 | 10/1972 | Weger | 455/11 |
| 3,723,876 | 5/1973 | Seaborn, Jr. | 455/11 |
| 4,083,003 | 4/1978 | Haemmig | 455/18 |
| 4,152,647 | 5/1979 | Gladden | 455/11 |
| 4,162,449 | 7/1979 | Bouyssounouse | 455/58 |
| 4,197,497 | 4/1980 | Phelps | 455/18 |
| 4,218,763 | 8/1980 | Kelley | 340/541 |

OTHER PUBLICATIONS

Rescu Emergency Location Alerting System.

The Guardsman—Control and Repeater System, Allied Technology Inc., between 1970–1971.

Rescu Emergency Location Alerting System, the Antenna Specialists Co., (published Aug. 1979), revised Jan. 1980.

*Primary Examiner*—Tommy P. Chin

*Attorney, Agent, or Firm*—Mills and Coats

[57] ABSTRACT

A compact and simple to operate transceiving device used by law enforcement officers, security agents, military personnel and the like to prerecord an emergency message prior to leaving his vehicle. In an emergency situation, the apparatus will automatically affect transmission of the above message to a central station if the user did not return to his vehicle in a preset amount of time.

13 Claims, 8 Drawing Figures

ASSISTANCE SUMMONING SYSTEM

This is a continuation-in-part of U.S. application Ser. No. 13,013, filed Feb. 21, 1979, by Alfred Z. Moore, entitled "REMOTE SUMMONING SYSTEM", now abandoned.

FIELD OF INVENTION

This invention relates to mobile radio equipment and more particular to police and/or other emergency personnel communication systems.

BACKGROUND OF INVENTION

In the past various remote type radio transmitters have been developed. Among these have been transmitters located in protected locations such as bank vaults where the trip switch will send a signal either to a police patrol car or the police station to notify them of unauthorized entry. Even more recently, patch through systems have been developed whereby a mobile transceiver can be wired into a relatively complex path through device which allows a portable transceiver, through the mobile transceiver, to talk to a remote base station. These latter units are not only complex in circuitry but also, because of their complexity, are subject to increased likelihood of failure, particularly in view of a relatively rough, abusive treatment mobile transceivers in general are subjected to.

None of the prior known devices of the types enumerated have been readily adaptable to preexisting mobile transceivers without requiring extensive rewiring. Special transmit and/or receive units have also been required and certainly the cost of prior known devices have been excessive at best.

Additionally, more specific emergency communication systems have been disclosed. Among these are U.S. Pat. No. 3,290,597 entitled "Emergency Assistance Radio Signalling System", issued to George R. Denny et al; U.S. Pat. No. 3,668,526 entitled "Communication System Having Means for Causing a Distress Signal" issued to Jerome S. Raskin; U.S. Pat. No. 4,107,611 entitled "Police Protection Method and Apparatus" issued to Jack N. Holcomb, Sr.; and U.S. Pat. No. 4,162,449 entitled "Apparatus for Communicating Receipt of Transmitted Signal" issued to Bernard Bouyasounaouse.

Although the above specific system provides for means by which an emergency voice message or distress signal can be transmitted to a remote station, they all incorporate one or more of the following disadvantages: (a) the user must always report his location prior to leaving his vehicle as taught by the Holcomb and Raskin patents; (b) the system requires central station equipment to decode the emergency message as taught by the Denny and Bouyasounouse patents; (c) the system requires mental recognition of a complex audio code as taught by Raskin patent; (d) the system requires mechanical tape transport mechanisms as taught by the Denny, Holcomb and Bouyasounouse patents which mechanisms are subject to likelihood of failure, particularly in view of the relatively rough and abusive treatment mobile transceivers are continually subjected to; (e) the system causes an emergency message or distress signal to be transmitted only one time as taught by the Denny, Holcomb, Bouyasounouse patents thereby greatly increasing the likelihood of not being received by the central station or nor clearly being understood; and (f) the reliability of the emergency message or distress signal being transmitted to the central station is dependent upon the user being within range of his mobile unit as taught by the Denny, Raskin, Holcomb and Bouyasounouse patents.

The fundamental deficiency of the above referred to patents is that they do not provide a flexible, easy to use, practical and fail-safe system that is readily adaptable to pre-existing mobile transceivers without requiring rewiring thereof.

BRIEF DESCRIPTION OF INVENTION

After much research and study into the above-mentioned problems, the present invention has been developed to provide a remote summoning device for use by personnel such as law enforcement officers, security agents, military personnel and the like. The device of the present invention includes a control unit, speech recorder and receiver embodied in a unitary housing. The unit is readily adaptable to pre-existing mobile transceiver by disconnecting the microphone from the standard mobile transceiver and then connecting the output of the unit into the mike jack of the pre-existing mobile transceiver. The microphone that was removed from the standard mobile transceiver is now connected to the input of the unit and thus provides a means for voice input to the unit to pre-record emergency messages. This easy but effective feature, provides universal retrofit to any pre-existing mobile transceiver equipment presently being used by law enforcement personnel, etc.

A preferred embodiment of the present invention relates to an emergency radio signaling system readily adapted to pre-existing mobile transceiver to be used by law enforcement officers to pre-record pertinent information such as location, vehicle description, license plate number, suspect description, time, etc., and to be automatically retrieved and transmitted over the existing mobile transceiver equipment if the officer needs assistance. The transmission of this information can be affected either automatically by the unit if the officer does not return to his mobile unit within a pre-set time or manually by a small portable transmitter carried on the user's person.

In view of the above, it is an object of the present invention to provide an emergency signaling device which, when activated, will transmit a prerecorded message to summon assistance.

Another object of the present invention is to provide for law enforcement officers and similar personnel, a means to summon help by mobile transceiver even when physically remote therefrom.

Another object of the present invention is to provide for law enforcement and similar personnel, a remote aid summoning device which is quickly and readily attachable and detachable from a standard mobile transceiver.

Another object of the present invention is to provide an assistance summoning device which can be activated from a remote location to transmit a predetermined signal or message through a standard mobile transceiver without rewiring, modifying or otherwise changing said transceiver.

Another object of the present invention is to provide an emergency help summoning device which connects to the microphone jack of a standard transceiver.

Another object of the present invention is to provide a remote summoning device for transmitting a prerecorded message over a standard mobile transceiver while operatively being connected to the microphone jack of said transceiver.

Another object of the present invention is to provide an emergency summoning device connected in line with the microphone of a standard mobile type transceiver whereby both microphone transmissions and emergency recorded transmissions can be made through the same transceiver.

Another object of the present invention is to provide a microphone patch-through feature which provides fail-safe operation through the invention to the existing radio equipment when it is desired to transmit the information to the central station without recording that information.

Another object of the present invention is to provide a method by which the information being transmitted to the central station can also simultaneously be recorded as it is being transmitted.

Another object of the present invention is to provide a function that can be used when the radio channels are crowded or when the situation does not appear to be threating wherein the information is recorded, but not transmitted unless the officer needs assistance.

Another object of the present invention is to provide a monitor function which permits the invention to also serve as a mobile logger to allow one who comes upon a scene of an abandoned officer's vehicle to retrieve the last stored information at the scene without having to contact the central station.

Another object of the present invention is to provide a test function which enables the user to verify the equipment's proper operation.

Another object of the present invention is to provide a means by which the invention can automatically be activated to switch the mobile transceiver to the transmit position and transmit the emergency information if the user has not returned to the vehicle within a pre-set amount of time of (from one minute to ninety-nine minutes).

Another object of the present invention is to provide a function whereby the transmission of the emergency message can be aborted if the unit has been accidentally activated.

Another object of the present invention is to provide a small portable transmitter carried on the user's person which can be used to activate the unit if the user is away from his vehicle and emergency assistance is required.

Another object of the present invention is to provide a means by which a security code is a part of the unit and is to be used by the officer to identify himself as an authorized user while an unauthorized user will cause the equipment to automatically transmit the recorded emergency information to the central station.

Another object of the present invention is to provide a five second audible warning to alert the user that the unit has been activated and that he, the user has a predetermined amount of time to abort the transmitted message if he chooses to do so to prevent the emergency message from being transmitted to the central station.

Another object of the present invention is to provide circuitry to allow a tape plug-in module that will provide the capability of recording approximately 360 prerecorded and/or transmitted messages, such module being started and stopped when the user's mike is keyed on or off and the tape used to store the information for easy removal and playback on any conventional tape player.

Another object of the present invention is to provide an omni-directional pattern with a 360 degree pick-up mike to allow hands free transmitting during emergency situations and also allow recordation of the same.

Another object of the present invention is to provide a five second one kHz burst tone at the beginning of each transmitted information to alert the dispatcher that emergency message is to follow.

Another object of the present invention is to provide a one kHz beep every one second in the message background to indicate that the received message is emergency information.

Another object of the invention is to provide a completely parallel device which will allow existing mobile radio equipment to operate even if the unit fails.

Other objects and advantages of the present invention will become apparent and obvious from a study of the following description and the accompanying drawings which are merely illustrative of such invention.

DETAILED DESCRIPTION OF INVENTION

Figure 1:
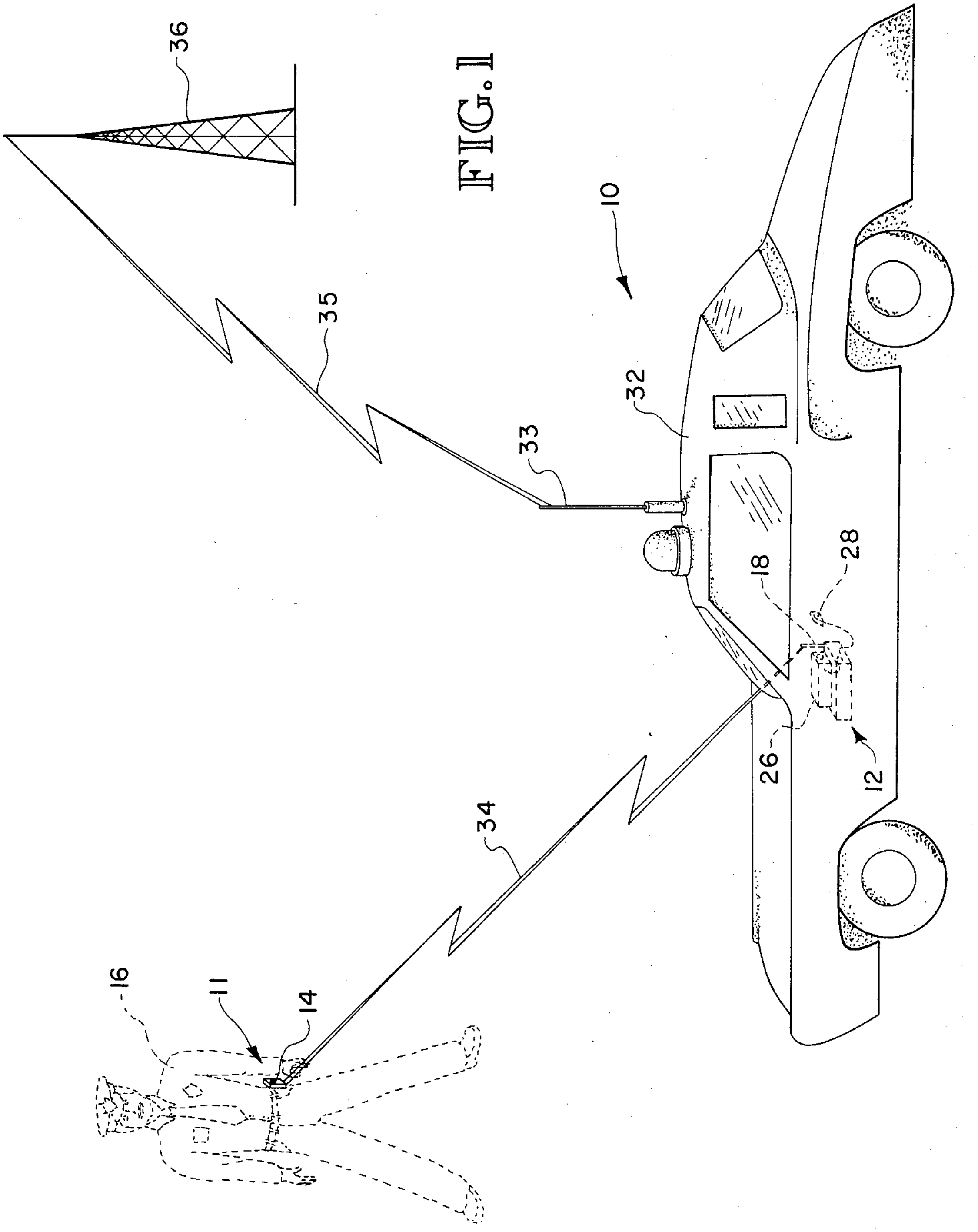
FIG. 1 is a block diagram of the remote summoning system of the present invention showing the overall operation of the same.
Figure 3:
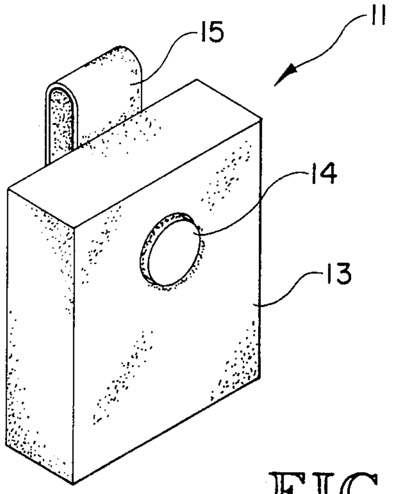
FIG. 3 is a perspective view of a typical belt type emergency signal transmitter.
Figure 2:
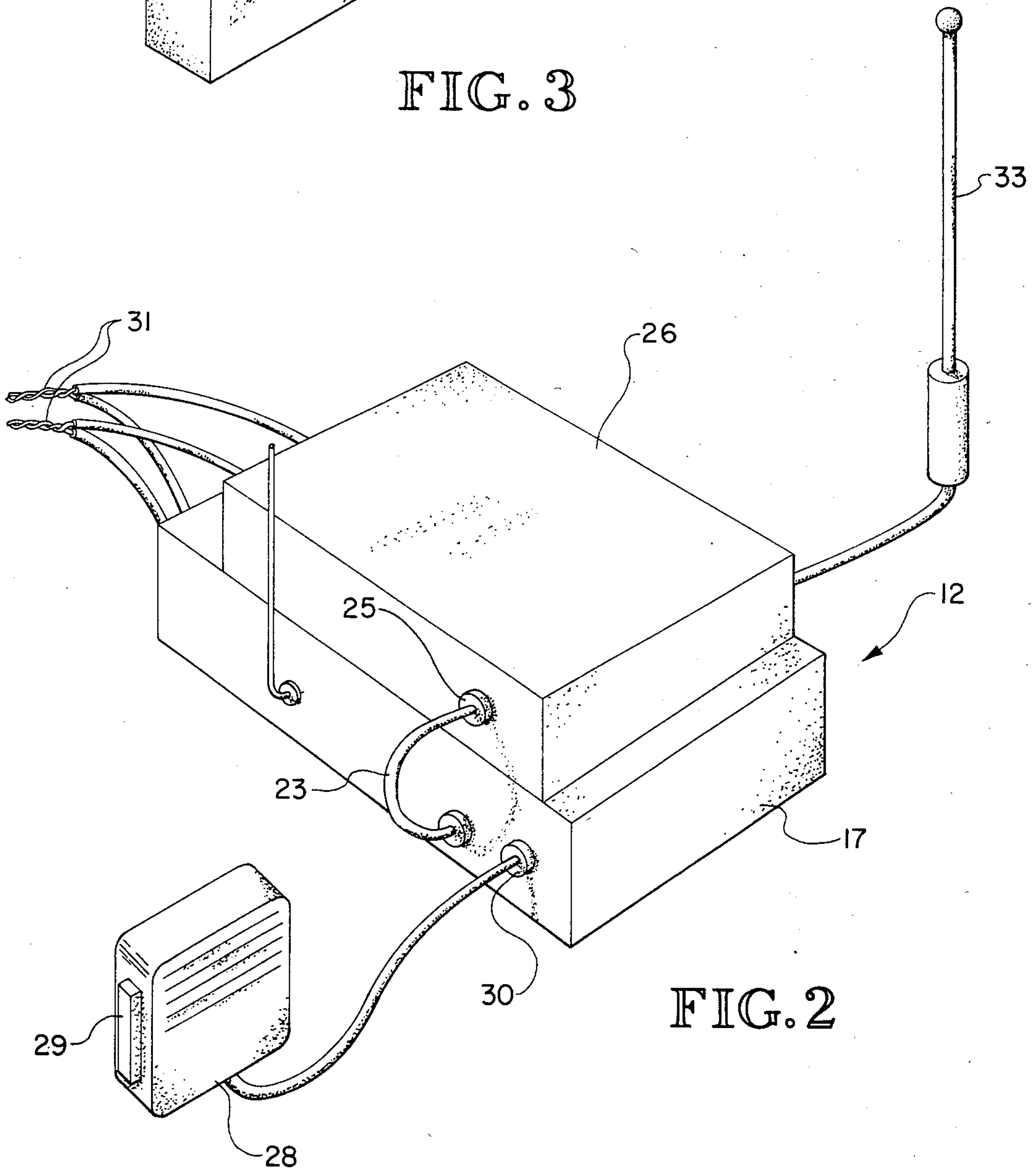
FIG. 2 is a perspective view of the system of the present invention installed for operation in conjunction with a standard mobile type transceiver.
Figure 4:
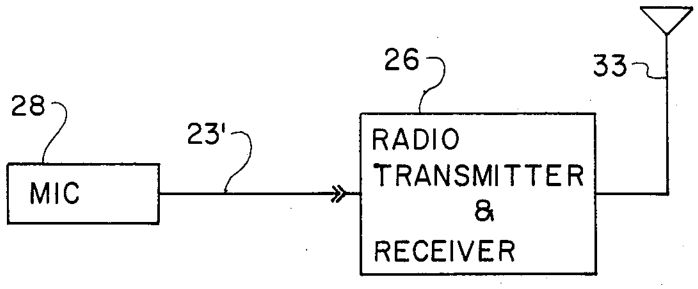
FIG. 4 is a block diagram of a typical prior art type transceiver.
Figure 5:
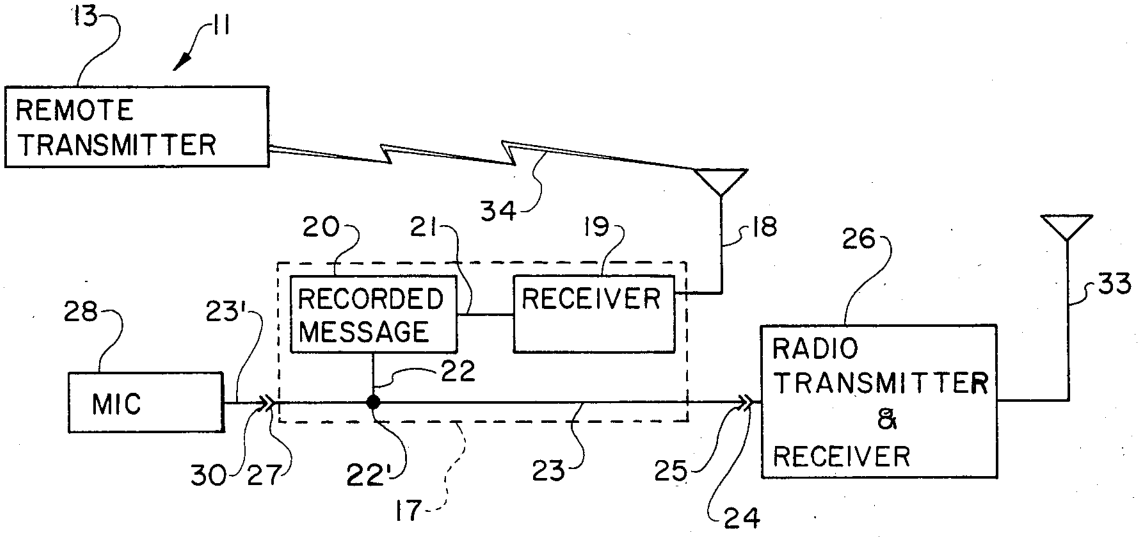
FIG. 5 is a block diagram of the system of the present invention installed in the microphone circuit of the transceiver of FIG. 4.

With further reference to the drawings, the remote summoning system of the present invention indicated generally at 10 is composed of a portable transmitter component 11 and a receiver/message component 12.

The transmitter component 11 can be any one of a number of small transmitters which are FCC approved as an electronic RF triggering device. Since units of these types are well known to those skilled in the art, further discussion as to the technical details of the same are not deemed necessary.

The transmitter 13 of component 11 includes a transmit key in the form of button 14. Also a mounting member 15 in the form of a hook, a belt engaging loop, or the like is provided for mounting the transmitter on the person of the user 16 thereof.

The receivers/message component 12 is contained within housing 17 and comprises an antenna 18 operatively connected to receiver section 19. This receiver can be of any one of a number of commercially available devices of this type for receiving a signal from transmitter 13. Whenever a signal is received by receiver 19 from transmitter 13, a control signal will be transmitted to message section 20 by line 21. Since receivers of this type having the capability of sending out an electrical control impulse upon being triggered are well known to those skilled in the art, a further discussion of the technical details of such receivers is not deemed necessary.

The message section 20 of the receiver/message component 12 of the present invention is preferably a recording playback type device which, when triggered by receiver section 19, will send its prerecorded message to transmit line 23 by way of connector line 22 and juncture 22'.

A microphone type plug 25 is operatively connected to one end of transmission line 23. This plug is adapted to releasably connect into the standard microphone jack 24 of standard mobile type transceiver 26.

The other end of transmit line 23 from plug 25 terminates in operative connection with microphone type jack 27. Standard microphone 28, which includes a transmit key or button 29 and a standard line cord 23' terminates in microphone plug 30. This plug is adapted to be used interchangeably with either transceiver mike jack 24 or receiver/message jack 27.

Although any convenient and conventional type of power source can be used in conjunction with both the mobile transceiver 26 and the receiver/message component 12, line cords 31 are shown for connection to an appropriate power source (not shown) such as the battery of vehicle 32.

Although the remote summoning system of the present invention can be used in a plurality of varying situations, one of the main situations that prompted its development is shown in FIG. 1 wherein the user 16 such as a police officer wears the portable transmitter component 11 on his belt 11. Should an emergency situation arise when he is remote from his vehicle or squad car 32 (which has permanently installed therein transceiver 26 with its operatively connected antenna 33) all he needs to do is push key or button 14 to activate transmitter 13 of transmitter component 11. A signal (illustrated graphically at 34) will be transmitted to antenna 18 of receiver section 19 of receiver/message component 12. This transmitted signal will cause receiver 19 to trip message section 20 by way of line 21. The message section will then send its prerecorded message over transmission line 23 by way of connector line 22. Transmission line 23 is operatively connected to the standard vehicle transceiver 26 by way of plug 25 and jack 24. The message is thus transmitted (as indicated graphically at 35) from antenna 33 to a remote receiving station 36 such as a police radio dispatcher.

When the message signal 35 is received, it will be realized that the officer or the user 16 is apparently in trouble and aid and assistance can be immediately dispatched to his pregiven location.

Although various other uses of the system of the present invention can immediately be envisioned, the system's universal adaptability to various makes and models of mobile mounted transceivers is one of its main keys to success. By patching the present invention through the microphone jack, use of such invention as hereinabove described can be accomplished while at the same time not impairing normal transmission and receive mode of the transceiver 26.

Should it be desired to move the device of the present invention readily from one vehicle to another such as from one police squad car to another, the line cords 31 of the receiver/message component can be connected to the power source (not shown) by a readily connectable and disconnectable means such as a cigarette lighter plug which, upon removal of the cigarette lighter, can be plugged directly into the open receptacle and easily removed therefrom. Thus by simply plugging the line cords 31 into the cigarette lighter and replacing the microphone with the receiver/message component, the device of the present invention can be made immediately operable and usable.

Figure 6A:
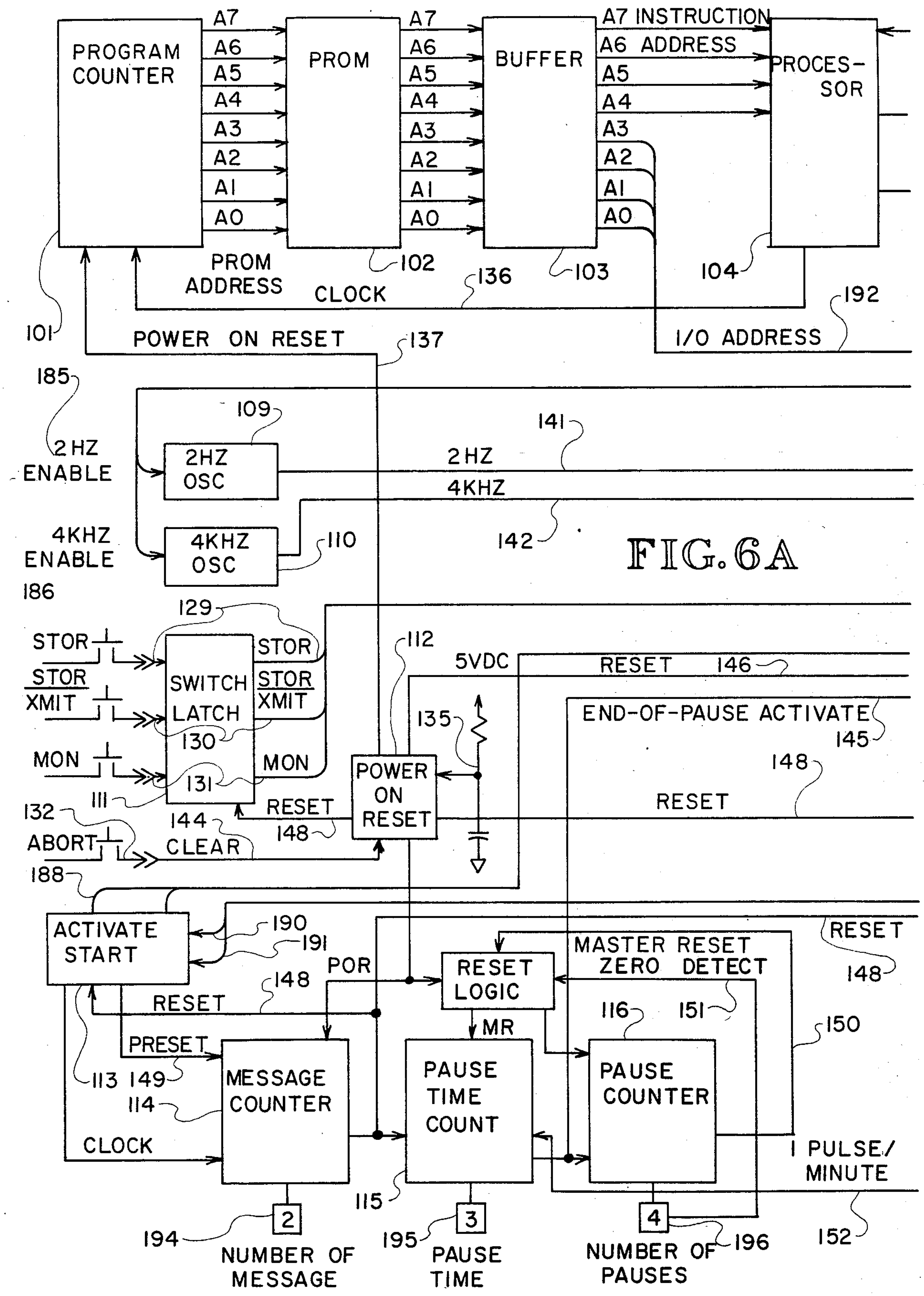
FIGS. 6A through 6C form a detailed schematic of the modified system of the present invention.
Figure 6B:
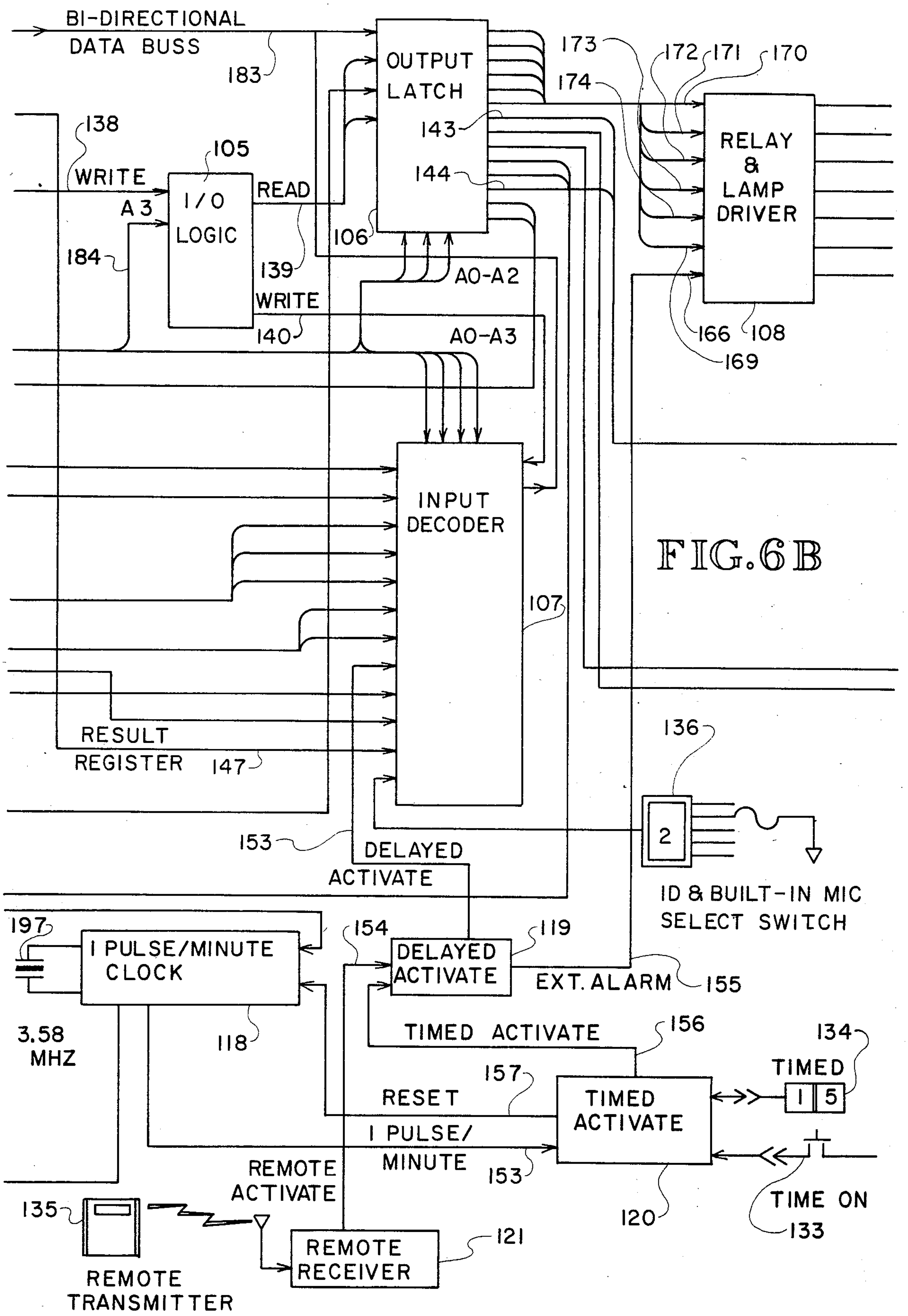
Figure 6C:
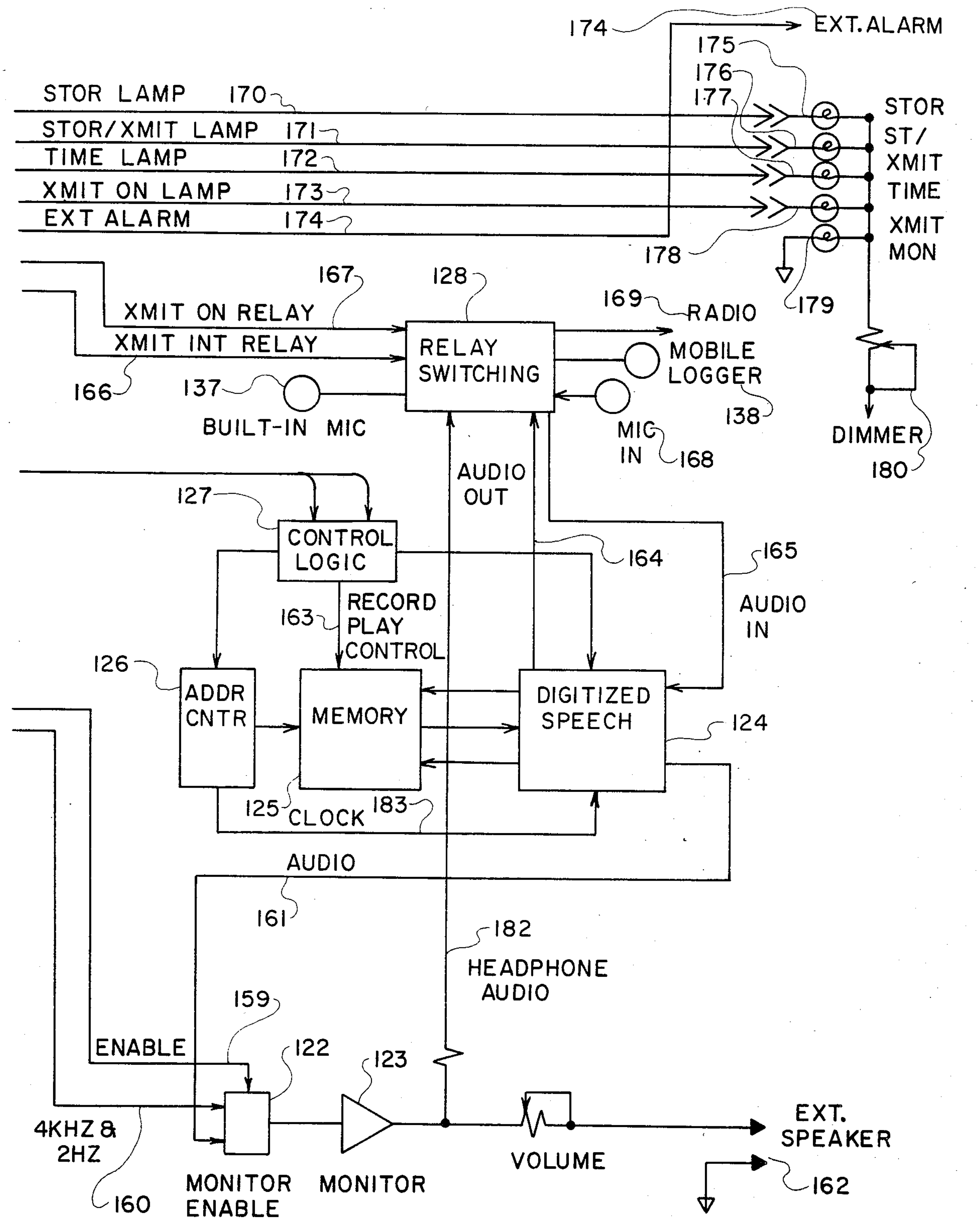

Referring specifically to the schematic shown in continuous form in FIGS. 6A through 6C the program counter 101 is a binary 0 to 255 counter which provides address line information (A0 through A7) from PROM (programmable read only memory) 102.

The program counter 101 is clocked from processor 104. The program counter 101 is reset by the action of the power-on-reset 112 circuit. This action occurs when power is applied to unit on resistor capacitor network 135 or depressing abort switch 132.

PROM 102 is a field programmable memory device that is used to store I/O address (A0–A3) information for input decoder 107, output latch 106 and I/O logic control 105. The PROM 102 also stores instructions (A4–A7) for use by the processor 104 in performing its task. Once the PROM 102 has been programmed it cannot be altered.

Buffer 103 is used to increase the drive capability of the information leaving the PROM 102. The signal entering and leaving are of the same polarity (non-inverted).

The processor 104 used is a single bit industrial control unit. It is designed for use in systems requiring decisions based on successive single bit information. The processor 104 forms a stored program controller that replaces combinational logic.

It has a bi-directional data buss 183 which will execute one program from PROM 102 per clock period. The processor 104 contains 16 instructions in its instruction set.

The processor 104 outputs a write 138 signal through I/O logic 105 when it wants to enable the input decoder 107.

It also helps produce a read 129 with the help of A3 184 and I/O logic 105 when it needs to tell output latch 106 to turn on or off an output.

The processor 104 provides a clock 136 for the program counter 101.

The I/O logic 105 block provides the read 139 and write 140 strobes (enables) for the input decoder 107 and the output latch 106. The I/O logic 105 forms the read 139 and write 140 strobes from A3 184 and processor 104 write 138 signal.

The output latch 106 decodes the address lines (A0–A2) from PROM 102 and when the read 139 strobes is present the bi-directional data buss 183 information, either 1 or 0 is fed into the proper output line (170–174; 166 and 167; 143 and 144; 159 and 160; 185 and 186; 190 and 191). This will turn on or off the proper output device. It is capable of addressing 16 devices.

Input decode 107 decodes I/O address (A0–A3) lines and when a write 140 command is detected will output the proper input (141 and 142; 129–131; 188 and 189; 145–147; 153) onto the bi-directional data buss line 183. It is capable of addressing 16 inputs.

All lamps 175–179 and relays 128 are driven by relay lamp driver 108. There are seven drivers in this IC capable of driving 200 MA each.

The 2 Hz oscillator 109 is enabled by a signal from the processor 104 through an output latch 106 connection 185.

The output of the 2 Hz OSC 109 is used with STOR 175, STOR/XMIT 176, time 177, xmit 178 lamps. It will flash them off and on at a 2 Hz rate when they are in use.

It is also used in conjunction with the 4 KHz oscillator 110 as a modulator.

The 4 KHz oscillator 110 is enabled in the same manner as the 2 Hz oscillator 109. It is taken from a different output line 186.

The 4 KH oscillator 110 is used as the emergency warning tone 159 and 160 when in activate 119 or monitor 131.

The switch latch 111 serves to latch on the momentary contact input switches 129 through 131. These outputs 129 through 131 are fed into the input decoder 107 to be used by system when required.

Power-on-reset 112 serves two purposes. When power is applied to unit a pulse is applied to power-on-reset 112 from resistor-capacitor network 135 and a reset 148 pulse is generated to reset all circuits. This prevents unit from coming on in an operational state.

The second purpose is to allow any sequence to be aborted (stopped) and all circuits to be cleared when the abort switch 132 is activated.

The activate start 113 circuit will upon receiving an activate start 191 signal from processor 4 will initiate the activate cycle of operation. It will signal the processor 104 to turn on xmit relay 167, initiate 4 KHz oscillator 110 and 2 Hz oscillator 109, preset the message counter 114 and trigger a 5 second delay at the end of which will activate the play signal 143 to start the digitized speech (124, 125, 126, 127) section to play the recorded message. At the end of message 190 it clocks the message counter 114 down by one and starts the process all over. The activate start 113 is also reset by POR 112.

The message counter 114 counts the number of message repeats that you have programmed by the number-of-messages switch 194. The number is variable for 1 to 9 and is set by a switch located on the printed circuit board.

When the count reaches zero the reset 148 line clocks the pause time counter 115 down one and resets the activate start 113 circuit. It also resets the 1 pulse/minute clock 118 to allow it to operate.

The message counter 114 is clocked once at end of each end-of-message 190 signal.

The number of pauses that you select are counted by the pause time counter 115. The number is variable from 1 to 9 minutes and is set by a switch located on the printed circuit board.

The pause time counter 115 is clocked by the 1 pulse/minute clock 118. It receives a pulse every 60 seconds. The pause time counter 115 is inhibited by reset logic 117 until it is needed.

When the pause time counter 115 reaches zero the output (end-of-pause activate) clocks the pause counter 116 once. The end-of-pause activate 145 signal starts the process of activate start 113 and message counter 114 over again.

The pause counter 116 counts the number of pauses from pause time counter 115 and when it reaches zero its master reset line 150 inhibits the pause time counter 115 and pause counter 116.

The number of pauses can vary from 0 to 9 and is pre-settable by a switch of the printed circuit board.

The reset logic 117 upon power on will master reset the pause time counter 115 and the pause counter 116 to inhibit them until the unit 15 activated. If the number of pauses 196 switch is in the zero position it will also hold the pause time counter 115 and pause counter 116 in master reset because they are not required if there are no pauses.

The 1 pulse/minute clock 118 provides a 1 pulse/minute time base for the pause time counter 115 and the timed activate 120 circuit.

When the 1 pulse/minute clock 118 is needed, it is reset either by the timed activate 120 or reset 157.

The 1 pulse/minute clock 118 begins as a 3.58 mHz 197 frequency for stability and accuracy and is divided to 1 pulse/minute to achieve the required time base.

When the system is activated by the timed activate 120 or the remote receiver 121, it triggers the delayed activate 119 to give an additional 15 second delay before the message is transmitted. At the end of the delay if the abort switch 132 has not activated the delayed activate 119 will send a delayed active signal 153 to the processor 104 to start the activate process.

In addition to the above it also outputs a five second signal to an external alarm 174 to warn the operator the unit has been activated.

The timed activate 120 and time switches 134 form a 1 to 99 minute timer when activated by the time on switch 133 will allow up to 99 minutes of delay before the unit is activated. The time 134 is front panel adjusted and is adjusted in one minute increments.

The timed delay 120 can be stopped by activating the time on 133 switch the second time.

The timer receives pulses at one minute intervals from the 1 pulse/minute clock 118. The timer also resets the 1 pulse/minute clock 118 when the time on switch 133 is activated to insure 60 seconds between pulses.

The unit can be activated from a remote receiver 121 located in the unit. When the remote receiver 121 receives a signal from the remote transmitter 35 the signal is sent to the delayed activate 119 circuit to start the activate process.

The monitor enable 122 allows the 4 KHz and 2 Hz 159 and 160 and the audio 161 to be mixed and fed into the monitor 123 where it is amplified and fed to the ear piece of his headset 168 and can also go to a remote speaker 162.

The audio and tone when in monitor 131 mode is fed into the monitor amp 123 which is an eight watt amp which will allow it to drive an external speaker through a "pad" type volume control. A portion of this audio is also sent to the speaker in his headset 168.

The audio from relay switching 128 and microphone. Input 168 is fed into the digitized speech 128 where the record 144 line is enabled during record functions.

The digitized speech 124 takes the analog audio signal from radio and changes it to a series of logic "ones" and "zeros". The audio is sampled sixteen thousand times/-second from the clock 183. If the audio is increasing in amplitude, then a series of "ones" is outputed from digitized speech 124 and if the audio amplitude begins to decrease a series of "zeros" are outputed at a 16 KHz rate.

The digitized speech 124 cannot only encode the audio but also decode.

When in STOR 129 or STOR/XMIT 130 mode, the samples of "ones" and "zeros" are stored in the memory 125 section. The memory is of the random access memory (RAM) type. It is capable of storing up to 20 seconds of audio.

The address counter addresses the memory 125 and the digitized speech 124 at the same time so that the "one" on "zero"0 can be stored to be used later.

This is the control logic 127 section which controls when the digitized speech 124 and memory 125 are in the record 144 or play 143 mode of operation. It also sync's the address counter 126 with the rest of the system.

The relay switching 128 section contains the relays to interrupt the transmitter 186 when in STOR/XMIT 130 mode and to turn on transmitter 186 (26) and transmit stored emergency message to a central station 187 (36) when in activate mode.

The microphone input 168 goes into the relay switching 128 then to digitized speech 124 and the audio output of digitized speech 124 is fed into relay switching 128 then to radio 169 connector.

The headphone audio 182 also goes into relay switching circuit.

Remote transmitter 135 (11) is a handheld device carried by the operator 16 to allow him to remotely activate the unit 12 of the present invention.

The ID and built-in switch 136 performs two functions. The switch will be pre-strapped for two codes. One code will activate the ID section which if the switch is not set on the proper code will cause the unit to be activated if someone attempts to use the device.

The second function of the switch 136 will activate a built-in mic 137 to allow the operator to transmit a message without using his radio microphone.

The mobile logger connector 138 provides for connecting an external recorder to the unit so that when the radio 186 or built-in mic 137 is activated the message will be stored.

The one minute pulses are used by the pause time counter in activate and timed activate counters.

In further describing the operation and use of the modification of the present invention, the STOR function is used when radio channels are crowded or when the situation does not appear to be threatening. The information is stored but not transmitted unless the officer 16 needs assistance.

When STOR switch is depressed the Q output of its latch goes "LO". The "LO" is inputed into the input decoder and the processor detects this as an active state. The processor then turns on the appropriate outputs.

The 2 Hz oscillator is enabled and its output is "anded" with the STOR latch signal by the processor which causes the STOR lamp to flash at 2 Hz rate.

The processor outputs a logic "HI" to be fed to the digitized speech section to put it into record mode.

The operator is now able to record his message into the digital speech section and for it to be stored in memory.

When the memory is filled an end-of-message signal will be generated which causes the processor to produce an end-of-sequence signal. This signal stops the STOR function and resets all circuits to their non-active state.

The STOR function can be aborted at any time by depressing the abort switch. The STOR function further overrides the monitor function.

The STOR-TRANSMIT simultaneously stores information as it is being transmitted. The STOR/XMIT function is the same as STOR with the following exceptions. The message not only is stored, but is also transmitted at the same time. The STOR/XMIT lamp flashes instead of the STOR lamp.

The STOR/XMIT not only overrides the monitor function, but also the STOR function.

When the monitor switch is activated Q output of monitor latch goes logic "LO". The processor enables 2 Hz and 4 KHz oscillators.

The monitor amp. is enabled and the digital speech is placed in play mode. The message along with 4 KHz tone (interrupted at 2 Hz is rate) is played through the headset (and or speaker). At the end-of-message all circuits are reset to non-active state.

The unit can be activated from two sources: (1) timed delay activate; (2) remote transmitter receiver activation.

The timed delay activate section can delay activation of unit from 1-99 minutes. The delay is front panel settable with thumbwheel switches.

When the time switch is activated the Q output of the time latch goes to logic "HI". This action tells the processor to enable 2 Hz oscillator and flash time lamp at 2 Hz rate. The time switch is debounced by schmitt trigger and presets a two decode BCD counter to the amount which is set on the thumbwheel switches. This also resets the master clock and removes the inhibit from the counters and allows them to count the one minute pulses.

The counters count down the preset amount of time and if the time lamp is still flashing the "0" output of the LSD counter goes logic "HI". This "HI" is fed to the delayed warning timer circuit which will start the activate process. If the time switch is depressed again before the time runs out the process will stop and the counters will be inhibited.

The remote activate input comes from the remote receiver board. The input goes logic "HI" when the handheld transmitter is activated. This signal is applied to the delayed warning timer.

Once the unit has been activated from either source, there is a one second audible alarm and a one minute delay before the message is actually transmitted. This allows the operator time to go back to the unit and abort the sequence if there need be any reason to do so.

The audible alarm also allows him to know when the unit has been activated. The audible alarm is optional and is located outside the vehicle 32.

Activation from either source triggers a one second timer and output goes "HI" for approximately one second. This "HI" is used to drive a transistor which will in turn drive a sonalert or other audible device.

This "HI" also sets the xmit on latch Q out to a "HI" and the processor turns on xmit on lamp. It also removes master reset (MR) from all circuitry used in the activate cycle.

Another timer is also triggered at the same time to start the delayed activate sequence. The delay will be approximately one minute. At the end of this delay if the abort switch has not been activated, the trailing edge of the delay will be fed to processor and an activate-cycle-start signal will be generated. This will set the activate cycle latch. The Q output goes "HI" and processor will turn on 2 Hz oscillator, and xmit relay. This allows a 4 KHz, interrupted at 2 Hz rate, tone to be transmitted as a warning that the following is an emergency message.

A five second delay also occurs at the same time to delay actual message from being transmitted for five seconds, to allow warning tone to alert dispatcher of pending emergency message. The trailing edge of this delay is inverted, shaped, and triggers activate play latch. This instructs processor to activate digitized speech section and allow message to be transmitted.

The modified system of the present invention has several modes of operation. section and allow message to be transmitted.

The modified system of the present invention has several modes of operation. It can repeat messages up to nine times, pause up to nine times.

Message Count with No Pauses:

After play latch has been triggered, unit proceeds to play message until digital speech section sends an end-of-message signal to processor. This will generate an activate delay again. The activate play latch will turn off the play signal.

The message counter will be clocked down one count which was preset at the beginning of a activate cycle by activate cycle latch.

The end of the delay will again trigger the activate play latch to start the sequence again. The process will continue until message counter reaches zero. At this time the "0" output of counter goes logic "HI" and resets (and holds in resets) the activate play latch. The reason for holding in reset is that the last end-of-message would trigger the delay and at the end of the delay would have triggered the activate play latch if line was not held "HI".

Since there were no pauses the zero count detector is logic "HI" which holds the pause time counter and pause count counter in master reset (MR) and disables them.

This will end the message count/no pauses cycle of operation.

Message Count With Pauses:

This sequence will allow you to have up to nine message counts with up to nine pauses which can have up to nine minutes of pause time.

The process is the same as above except the pause counter is not allowed to be pre-set at the end of the one minute delayed activate period.

When the message counter reaches zero the "0" output goes logic "HI" and functions as above, but also presets pause time counter, resets master clock and resets activate cycle latch which instructs processor to deactivate 2 Hz oscillator, 4 KHz oscillator and Xmit relay.

The unit is now in pause time. The pause time counter will not count down from pre-set number once each minute until it reaches zero. During this time the operator can use radio if necessary, but he will know it is in activate cycle because xmit on lamp will be flashing and will continue to flash until abort switch is activated. The "0" output goes logic "HI" which inhibits counter from functioning. It also clocks pause count counter down by one and becomes the end-of-pause activate signal to processor which sets the activate cycle latch and starts the process over again.

The process continues until pause counter reaches zero. The "0" output goes logic "HI" which inhibits the pause counter from counting and holds the pause time counter in master reset (MR) which prevents it from counting.

The "0" output of pause time counter will still allow unit to play pre-set number of messages one more time to complete cycle, but will not go into anymore pauses, because pause time and pause counters are inhibited.

| | | |
|---|---|---|
| Example: | Message Count | 2 |
| | Pause Time | 1 |
| | Number of Pauses | 3 |

-continued

| | | |
|---|---|---|
| Begin | 2 messages | pauses 1 minute |
| Plays 2 messages | | pauses 1 minute |
| Plays 2 messages | | pauses 1 minute |
| plays 2 messages | | END |

At any time during any operation the sequence can be stopped by activating the abort switch. This action reset all circuits to their non-active state. The unit is now ready to be used again.

Prior to the use of the system to transmit an emergency message for assistance, a message is pre-recorded on the speech recorder.

EXAMPLE I

Prior to leaving his vehicle, a user pushes the "STOR/XMIT" button and transmits the following to the dispatcher: "C122 stopping 1969 blue LTD Ford, license plate #MJH 365, location I95 and 70A, suspected DUI, two suspects in vehicle". If during the attempted arrest the officer was wounded and needed assistance for any reason and could not return to his vehicle to radio for help, he could have pressed his activating button on his portable transmitter on his person. The above prerecorded information would have been transmitted as many times with as many pauses in between as had been programmed for. The beep tone transmitted with the message indicated that it was an emergency and help could have been dispatched to the officer's location.

EXAMPLE II

The same situation as in the above example except the officer could not activate the portable transmitter carried on his person, either he was prevented from doing so or the portable transmitter on his person failed. In this case, if a pre-selected time, say ten minutes had been programmed into the device before the officer left the vehicle, the present invention would automatically be activated because the officer would not have returned to his vehicle and "reset" the invention within the pre-selected ten minutes. Again, the officer's location and distress would have been known and help dispatched.

EXAMPLE III

Same as Example I above except the radio channels were crowded and the officer did not judge the situation to be threatening so he only recorded the information and did not transmit the information to the dispatcher. Again, should the device be activated, either remotely or automatically, the stored information would be transmitted. But, for this case, assume for some reason that the emergency information had not been transmitted through the mobile transreceiver to the central station. Either the officer negelected to set his automatic function or was taken hostage or was killed instantly and was unable to remotely activate the portable transmitter carried on his person. When the officer's vehicle is discovered, the description of the suspect's car, license plate number, etc., that never got transmitted could be retrieved at the scene by pressing the "monitor" button on the present invention.

From the above, it can be seen that the present invention is relatively inexpensive to produce, is extremely simple to connect for operation and can readily be moved from transceiver to transceiver if so desired.

The present invention may, of course, be carried out in other specific ways than those herein set forth without departing from the spirit and essential characteristics of the invention. The present embodiments are, therefore, to be considered in all respects as illustrative and not restrictive and all changes coming within the meaning and equivalency range of the appended claims are intended to be embraced herein.

What is claimed is:

1. An assistance summoning system comprising: a two-way communication type transceiver having a transmitter section; a receiver/message component including a receiver section and a programmable message section; means operatively connecting said receiver section to said programmable message section; means for operatively connecting said programmable message section to said transmitter section of said transceiver whereby information from said programmable message section can be fed into and thus transmitted by said transceiver upon the happening of a predetermined programmed event; a control means within the confines of the assistance summoning system for causing a programmed message from said message section to be automatically transmitted a selected number of times by said transceiver after the elapse of a selected length of time from the activation of said control means; and a security code receiving means operatively connected to said summoning system to allow an authorized user to operate the system with any unauthorized use causing the system to automatically transmit a programmed message.

2. The system of claim 1 including a means for recording a message for later transmission simultaneously with the transmission of a message through said transceiver.

3. The system of claim 1 including a means for logging transmitted messages whereby most recently transmitted information can be retrieved.

4. The system of claim 1 including a means to test the function of the system to verify proper operation.

5. The system of claim 1 including means for allowing the transmission of a programmed message to be aborted upon accidental activation.

6. The system of claim 1 including means for producing an audible tone at the beginning of each transmitted message.

7. The system of claim 1 including visual status indicators.

8. The system of claim 1 wherein said programmable message section includes digitized speech means with electronic memory.

9. The system of claim 1 including means for storing a predetermined message for later transmission.

10. The system of claim 1 including means for monitoring ambient noises such as conversations.

11. The system of claim 10 including means to simultaneously transmit and record said ambient noise.

12. The system of claim 10 including means to selectively transmit or record said ambient noises such as conversations.

13. The system of claim 1 including means to set varied time periods between repeated transmissions.

* * * * *